United States Patent [19]

Kuznetsov

[11] 4,234,675

[45] Nov. 18, 1980

[54] DRY FILM PHOTOSENSITIVE RESIST

[76] Inventor: Vladimir N. Kuznetsov, ulitsa Jubileinaya, 6, kv. 73, Istra Moskovskoi oblasti, U.S.S.R.

[21] Appl. No.: 16,068

[22] Filed: Feb. 28, 1979

Related U.S. Application Data

[63] Continuation of Ser. No. 822,569, Aug. 8, 1977, abandoned.

[30] Foreign Application Priority Data

Aug. 10, 1976 [SU] U.S.S.R. .............................. 2382553

[51] Int. Cl.$^3$ .............................................. G03C 1/68
[52] U.S. Cl. .................................. 430/271; 430/281; 430/905; 430/910
[58] Field of Search .................. 96/67, 87, 28, 35.1, 96/115 P; 430/271, 281, 905, 910

[56] References Cited

U.S. PATENT DOCUMENTS

| | | | |
|---|---|---|---|
| 3,245,796 | 4/1966 | Burg | 96/67 |
| 3,770,438 | 11/1973 | Celeste | 96/28 |
| 3,785,817 | 1/1974 | Kuchta | 96/28 |
| 3,878,076 | 4/1975 | Nishikubo et al. | 96/115 P |
| 3,935,330 | 1/1976 | Smith et al. | 96/115 P |
| 3,936,366 | 2/1976 | Green | 96/115 P |
| 3,949,143 | 4/1976 | Schlesinger | 96/115 P |
| 3,992,275 | 11/1976 | Shahidi et al. | 96/115 P |

*Primary Examiner*—Jack P. Brammer
*Attorney, Agent, or Firm*—Lackenbach, Lilling & Siegel

[57] ABSTRACT

A dry film photosensitive resist, according to the invention, is a flexible laminated structure consisting of three layers of which the first is a transparent polymer film transmitting UV radiation and having a thickness of 5–100$\mu$; the second of said layers being a light-sensitive layer having a thickness of 5–1,000$\mu$ and comprising a combination of a carboxyl-containing polymer-thickener, a polar oligomer, and a monomeric substance having a boiling point above 200° C. at 760 mm Hg; the third of the layers being a film from a polymeric substance having a thickness of 5–100$\mu$, the last-mentioned layer being a protective layer for the light sensitive layer and being disposed thereon. All the three layers are adhesively bonded together. The light-sensitive layer contains as the carboxyl-containing polymer thickener, a water insoluble copolymer of a monomer or a mixture of monomers having a neutral reaction with the carboxyl-containing monomer.

40 Claims, No Drawings

DRY FILM PHOTOSENSITIVE RESIST

This is a continuation of application Ser. No. 822,569, filed Aug. 8, 1977, now abandoned.

The present invention relates to compositions of light-sensitive polymer materials used for printed circuitry, and more particularly to dry film photosensitive resists.

Dry film photosensitive resists can be used for manufacturing conductors of printed circuit boards, printed windings, scales, grids, and other items by the photochemical method.

BACKGROUND OF THE INVENTION

Known in the art are dry film photosensitive resists which are a flexible laminated structure consisting of three layers of which the first is a transparent polymer film transmitting UV radiation and having a thickness of 5–100μ; the second of said layers is a light-sensitive layer having a thickness of 5–1,000μ and comprising a combination of a carboxyl-containing polymer-thickener, a polar oligomer, and a monomeric substance having a boiling point above 200° C. at 760 mm Hg; the third of the layers is a film from a polymeric substance having a thickness of 5–100μ and being protective for said light-sensitive layer and disposed thereon.

In one of the known dry film photosensitive resists a light-sensitive layer contains as a carboxyl-containing polymer-thickener a water insoluble copolymer of methylmethacrylate with 10 mol.% of methacrylic acid, as a monomeric substance and a polar oligomer pentaerythritol triacrylate is used. The light-sensitive layer also contains additives of photoinitiators of radical polymerization or a mixture thereof, inhibitors of radical thermopolymerization, dyes, and placticizers.

The use of pentaerythritol triacrylate in combination with the above-cited polymer-thickener makes it possible to obtain dry film photosensitive resists possessing a satisfactory spectrum of properties including stability in galvanic electrolytes.

However, qualitative development of such dry film photosensitive resists is impossible when aqueous developers are used containing no organic substances. For developing the above-cited photosensitive resists, considerable amounts (up to 10 vol.% and more) of organic solvents are usually introduced into the developer, such as butyl cellosolve, as well as surfactants, usually nonionogenic.

Organic substances contained in the developer are rather difficult to remove from the spent developer; therefore, when the above-cited dry film photosensitive resists are used, environmental contamination takes place, which, under the conditions of mass production, may present a serious ecological problem.

The development of dry film photosensitive resists with aqueous solutions containing no organic substances becomes possible when the acidity of the carboxyl-containing polymer-thickener is increased. For example, if a copolymer of methylmethacrylate with 35 mol.% methacrylic acid is used as a polymer-thickener and pentaerythritol triacrylate as a monomeric substance, the light-sensitive layer is well developed with a 1% aqueous solution of sodium carbonate without the addition of organic solvents. But in this case the chemical stability of the photosensitive resist decreases considerably.

When pentaerythritol triacrylate is replaced by less hydrophilic and, consequently, more stable in aggressive media, monomeric substances, such as pentaerythritol tetraacrylate or trimethylolpropane trimethylacrylate, the chemical stability of the photosensitive resist can be increased. However, this is accompanied by deterioration of the compatibility of the light-sensitive layer components and by instability of adhesion of the light-sensitive layer to the substrate, where the photosensitive resist is applied, especially after prolonged storage.

Thus, because of the above-mentioned disadvantages, the field of application of the known dry film photosensitive resists is limited.

BRIEF DESCRIPTION OF THE INVENTION

It is an object of the invention to provide such a composition of a dry film photosensitive resist, which will make it possible to develop said photosensitive resist with aqueous solutions of weak alkalies without the addition of organic substances and to ensure its high stability in acidic media.

Said object is accomplished by the provision of a dry film photosensitive resist which is a flexible laminated structure consisting of three layers of which the first is a transparent polymer film transmitting UV radiation and having a thickness of 5–100μ; the second of said layers being a light-sensitive layer having a thickness of 5–1,000μ and comprising a combination of a carboxyl-containing polymer-thickener, a polar oligomer, and a monomeric substance having a boiling point above 200° C. at 760 mg Hg; the third of said layers being a film from a polymeric substance having a thickness of 5–100μ, the last-mentioned layer being a protective layer for said light-sensitive layer and being disposed thereon, all the three said layers being water insoluble copolymer of a monomer or a mixture of monomers having a neutral reaction with the carboxyl-containing monomer, the content of the carboxyl-containing monomer in the copolymer ranging from 20 to 50 mol.%. The polar oligomer in said light-sensitive layer is a hydroxylcontaining compound obtained through chemical addition of an organic acid to epoxy resins or mixtures thereof and having a chain length of from 300 to 3,000 carbon units. The monomeric substance in said light-sensitive layer is a fully substituted ester of a polyatomic alcohol with carboxylic acids, at least two hydroxyl groups of the polyatomic alcohol being substituted by residues of acrylic and/or methacrylic acids; the weight ratio of said polymer-thickener, polar oligomer, and monomeric substance being 100:15–100:15–100 respectively.

It is recommended to use a photosensitive resist wherein the light-sensitive layer contains as a carboxyl-containing polymer-thickener a water insoluble copolymer of 50 mol.% of styrene with 50 mol.% of monoisobutyl ester of fumaric acid, and as a polar oligomer said light-sensitive layer contains a hydroxyl-containing compound obtained through chemical addition of methacrylic and/or acrylic acids to an epoxy resin. It is desirable that as a monomeric substance the light-sensitive layer should contain 1,1,1-trimethylpropane triacrylate.

To increase light sensitivity, the light-sensitive layer of the herein-proposed dry film photosensitive resist may contain photoinitiators of radical polymerization, the content of said initiators being from 2 to 20% by weight of the carboxyl-containing polymer-thickener.

Aromatic ketones, aromatic diketones, said multinucleous quinones can be used as photoinitiators of radical polymerization.

For enhancing plasticity and reducing brittleness, the light-sensitive layer may contain a plasticizer in the amount of from 5 to 25% by weight of the light-sensitive layer.

Dibutylphthalate, glycerol triacetate, and trimethylolpropane triacetate can be used as a plasticizer.

To increase the duration of storage of the dry film photosensitive resist, inhibitors of radical polymerization may be included into the composition of the light-sensitive layer in the amount of 0.01 to 5.0% by weight of the carboxylcontaining polymer-thickener. For example, as inhibitors of radical polymerization use can be made of phenols, namely, hydroquinone or paramethoxyphenol. For contrast dyeing of the light-sensitive layer, the latter may contain dyeing substances in amounts of from 0.1 to 5.0% by weight of carboxyl-containing polymer-thickener. As dyeing substances use should be made of triphenylmethane dyes, namely, "Methylviolet", "Crystalline violet", and "Rhodamin Ӂ".

The herein-proposed dry film photosensitive resist contains as the first layer preferably a film from polyethylene terephthalate and as the third protective layer preferably a film from polyethylene.

DETAILED DESCRIPTION OF THE INVENTION

According to the invention, the dry film photosensitive resist is prepared in the following way.

A 20-40% solution of a light-sensitive layer comprising a carboxyl-containing polymer-thickener, a polar oligomer, and a mononeric substance in a highly volatile solvent is applied by way of uniform spraying through a spinneret to a transparent polymer film (substrate) having a thickness of 5–100μ and transmitting UV radiation in the region of 300–400 nm, for example, polyethylene terephthalate film.

As a carboxyl-containing polymer-thickener use is made of water insoluble copolymers obtained by polymerization of two or more monomers, one of which is an unsaturated acid, for example, acrylic, methacrylic, maleic, fumaric, itaconic, or an acid monoester of an unsaturated acid, for example, monoisoamyl ester of maleic acid. The second monomer is water insoluble, i.e. its solubility in water at 20° C. does not exceed 3 weight % and pH is approximately equal to 7. The second monomer can be, for example, alkylmethacrylates and alkylacrylates containing from 1 to 10 carbon atoms in an alcohol radical; styrene and its derivatives capable of copolymerizing which are substituted in α-position or in the aromatic ring; esters of vinyl alcohol, for example, vinyl acetate or vinylpropionate; ethers of vinyl alcohol, for example, vinyl-n-butyl ether; sterically hindered monomers incapable of homopolymerization, such as stilbene; dienes capable of copolymerization with the formation of soluble copolymers such as butadiene or diallyl phthalate. In addition, the second monomer can consist of the above-cited water insoluble monomers in a mixture with water soluble monomers such as methacrylamide, acrylamide or a mixture thereof, monomethacrylate, and ethyleneglycol monoacrylate (the content of water soluble monomer in the mixture should be relatively small—no more than 20 mol.%).

It is preferable to use water insoluble copolymers with a molecular weight from 2 to 200 thousand conventional units. Water insoluble copolymers, in case of their mutual compatibility in the presence of the other components of the light-sensitive layer, may enter into the composition of the dry film photosensitive resist as a mixture.

As a polar oligomer, hydroxyl-containing compounds are used, obtained through chemical addition of organic acids to epoxy resins or their mixtures, said epoxy resins being characterized by a high hydroxyl number (usually 4–8 weight % of OH-groups) and a minimum epoxy number which is, as a rule, no more than 10% of the initial epoxy number of the epoxy resin being used. It is preferable that the epoxy number of the polar oligomer be equal or close to zero.

Mono- and dicarboxylic acids having a molecular weight no higher than 200 conventional units are usually used for obtaining a polar oligomer. The use of a mixture of organic acids is also possible. Unsaturated acids or their monosubstituted derivatives are most widely applied for producing a polar oligomer. Among them are acrylic, methacrylic, α-halogen acrylic, maleic, fumaric, or itaconic acid. Dibasic carboxylic acids can be used in the form of anhydrides if their interaction with epoxy resins does not yield insoluble products with a three-dimensional structure and if the epoxy number of the obtained oligomer does not drop below 3 weight % of the OH-groups.

Epoxy resins for producing a polar oligomer may have initial content of the epoxy groups

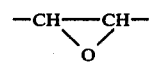

(I) from 3 to 40 weight %; the molecule of epoxy resin may have from 1 to 10 epoxy groups in the form of glycide residue

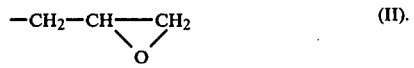

The initial epoxy resins can be liquid, viscous-fluid or solid, depending on their molecular weight and structure. Solid epoxy resins are amorphous or crystallizing substances.

Initial epoxy resins can be obtained by direct epoxidation of unsaturated compounds, for example, low-molecular polybutadiene, vinylcyclohexane, and peroxide compounds, or by condensation of low-molecular epoxy compounds, such as epichorohydrin, with compounds having mobile atoms in the molecule: phenols (for example, 4,4-dihydroxy-2,2-diphenylpropane, hydroquinone, pyrogallol; aliphatic polyatomic alcohols (pentaerythritol, trimethylol propane, and ethyleneglycol); amines (aniline, metaphenylene diamine); dicarboxylic acids (phthalic, adipic, or maleic); cyanuric acid; and phenol formaldehyde resins. It is also possible to apply mixed epoxy resins obtained, for example, by joined condensation of two different bisphenols, as well as modified epoxy resins obtained by inter-action of low-molecular di- and polyepoxy products with compounds containing mobile atoms, for example, phenols.

To obtain a polar oligomer, it is most preferable to use epoxy resins on the base of 4,4'-dioxy-2,2-diphenyl propane (bisphenol A).

A polar oligomer can be obtained by catalytic addition of organic acids to the above-cited epoxy resins in the presence of weak bases and/or upon heating of the reaction mixture up to 80°–200° C.

As a monomeric substance entering into the composition of the light-sensitive layer use is made of fully substituted esters of polyatomic alcohols. This means that these monomers do not contain free hydroxyl and carboxyl groups which may be present as slight impurities only. It is very important that the monomer molecule contain at least two ester groups of acrylic and/or methacrylic acids.

For example, suitable are the following compounds: trimethylol propane trimethacrylate; trimethylolpropane triacrylate; pentaerythritol tetramethacrylate; pentaerythritol diacetate dimethacrylate; pentaerythritol diacetate diacrylate; triethyleneglocyl acrylate methacrylate; dimethacrylate (bis-ethyleneglycol)-phthalate; diacrylate(bis-ethyleneglycol)-phthalate; tetramethacrylate(bis-trimethylolpropane)-succinate; tetracrylate(bis-trimethylolpropane)-succinate.

For increasing light sensitivity, the herein-proposed dry film photosensitive resist may contain photoinitiators of radical polymerization, for example, aromatic ketones or multinucleous quinones: benzophenone, Michler ketone, dibenzoyl, benzoine methylate, 2-tert-butyl anthraquinone, or mixtures thereof. A photoinitiator is introduced usually in an amount of 2–20% by weight of the carboxyl-containing polymer-thickener. Photoinitiators or their mixtures may be introduced into the light-sensitive layer either as individual compounds or as chemically bonded with one of the components of the light-sensitive layer. It is possible to use photoinitiators in combination with activators (accelerators) of radical photopolymerization, for example, N-phenyl glycine, the content of activators being usually 0.5–5.0% by weight of the carboxyl-containing polymer-thickener.

Enhanced plasticity and reduced brittleness of the irradiated light-sensitive layer are attained by introduction into the composition of the light-sensitive layer plasticizers such as dialkyl ($C_1$–$C_{10}$) esters of dicarboxylic acids, esters of polyatomic alcohols, and the like (for instance, dibutyl phthalate, glycerol triacetate, glycerol-1,3-diacetate, trimethylolpropane triacetate). A plasticizer is usually added in an amount of from 5 to 25% by weight of the light-sensitive layer.

For increasing the duration of storage of the dry film photosensitive resist, the light-sensitive layer may contain inhibitors of radical polymerization, such as phenols, namely, hydroquinones, para-methoxyphenol, para-tert-butylphenol formaldehyde resin in an amount of 0.01–5.0% by weight of the carboxyl-containing polymer-thickener.

To make the light-sensitive layer contrast and perfectly visible for visual quality control of the items obtained with the use of the dry film photosensitive resist, the layer should contain dyeing substances such as triphenylmethane dyes: "Methyl violet", "Crystalline violet" and others, or finely dispersed pigments in an amount of 0.1–5.0% by weight of the carboxyl-containing polymer-thickener.

After applying the light-sensitive layer to the substrate, it is dried by flowing with air at 20°–150° C. for 0.5–5 minutes. Then, a protective layer having a thickness of .5–100$\mu$, for instance, a polyethylene film, is applied to the light-sensitive layer with the aid of a roller covered with rubber. After that the resultant dry film photosensitive resist is rolled into a reel (600 mm in width and up to 300 m long).

Owing to the above-cited combination of components of the light-sensitive layer, the herein-proposed dry film photosensitive resist can be developed with aqueous solutions of weak alkalies, such as carbonates, bicarbonates, and silicates of alkali metals, without the addition of any organic substance into the developer. Sufficiently high chemical stability of the photosensitive resist makes it fit for use when manufacturing items of printed circuitry both by the negative and positive combined method. Thus, the chemical stability of the proposed photosensitive resist is sufficient for etching copper foil with ferric chloride solution to the depth of 100$\mu$ and over; for galvanic precipitation of copper from a sulphate electrolyte during 1 hour and more with subsequent galvanic covering by a tin-lead alloy from a fluoboric electrolyte during 1 hour or more. After performing photolitographic operations, a protective relief based on the proposed dry film photosensitive resist can easily be removed from the surface of the item by 5–20% aqueous solution of alkalies (NaOH, KOH, etc.).

The spent solutions of the developer and of the removing agent are neutralized with inorganic acids. The components of the light-sensitive layer of the photosensitive resist can be isolated from the aqueous phase.

The proposed photosensitive resist can be used on conventional equipment which is employed for mechanized treatment of the known dry film photosensitive resists.

For a better understanding of the present invention specific examples of preparing the proposed dry film photosensitive resist are given hereinbelow by way of illustration.

EXAMPLE 1

A light-sensitive layer 35$\mu$ in thickness is applied to a polyethylene terephthalate film (a substrate) by way of uniform coating thereof through a spinneret. The composition of the light-sensitive layer is as follows (in weight parts):

copolymer of styrene with monoisobutyl ester of fumaric acid (50:50 mol.%)—100.0;

product of addition of methacrylic acid to an epoxy resin based on 4,4'-di-hydroxy-2,2-diphenylpropane (molecular weight of the product is 600 conventional units, acidic number is 2 mg KOH/g; content of residual epoxy groups is 0.4 weight %)—50.0;

dimethacrylate(bis-ethyleneglycol)-phthalate—50.0.

The coating is performed from a solution of the components in an acetone-isopropanol mixture having a viscosity of 18 sec by viscosimeter at 20° C.

The light-sensitive layer is dried by blowing with air at 50° C. for 10 minutes, after which a protective polyethylene layer 20$\mu$ thick is applied to the light-sensitive layer with the aid of a roller covered with a rubber layer. The three-layer system is rolled into a reel.

The obtained dry film photosensitive resist is applied, after removing the protective layer, to the surface of copper foil purified from oxides and fat impurities; the application is performed with the help of a standard roller laminator, the temperature of its heating elements being 115°±3° C.

An arrangement equipped with 1 kW mercury high-pressure lamps is used for the exposure of the sample. The time of the exposure through a film photographic mask is 40 min. During the exposure the sample is intensively cooled with air to avoid thermal polymerization of the light-sensitive layer.

After the exposure, the polyethylene terephthalate film is removed stripped off from the light-sensitive layer and the sample is developed on a jet apparatus with a 2% aqueous solution of sodium carbonate for 1 minute.

The protective relief thus obtained is stable in a sulphate electrolyte for galvanic precipitation of copper and in a fluoroborate electrolyte for galvanic precipitation of tin-lead alloy (60 minutes of exposure in each electrolyte under conditions of subsequent galvanic covering).

After the galvanic covering has been performed, the protective layer can be removed with a 10% aqueous solution of KOH.

EXAMPLE 2

A dry film photosensitive resist is obtained by following the procedure described in Example 1 and then a light-sensitive layer is applied to a polyethylene film. After that a polyethylene terephthalate film is applied to the light-sensitive layer with the aid of a roller covered with a rubber layer.

The dry film photosensitive resist obtained has the properties similar to those described in Example 1.

EXAMPLE 3

A dry film photosensitive resist is obtained and treated by following the procedure described in Example 1, but 10 weight parts of a photoinitiator (benzoine ethylate) are introduced into the composition of the light-sensitive layer.

For exposure of the sample, an arrangement is used equipped with 1 kW mercury high-pressure lamps. The time of the exposure through a film photographic mask is 50 sec. During the exposure the sample is cooled intensively with air to avoid thermal polymerization of the light-sensitive layer.

After the exposure the polyethylene terephthalate film is removed (stripped off) from the light-sensitive layer and the sample is developed on a jet apparatus with a 2% aqueous solution of sodium carbonate for 1 minute.

The protective relief thus obtained is stable in a sulphate electrolyte used for galvanic precipitation of copper and in a fluoroborate electrolyte used for galvanic precipitation of a tin-lead alloy (the exposure in each electrolyte is 60 minutes under the condition of subsequent galvanic covering).

EXAMPLE 4

A dry film photosensitive resist is obtained by following the procedure described in Example 3, but 0.3 weight parts of "Methyl violet" dye are introduced into the composition of the light-sensitive layer. The properties of the dry film photosensitive resist obtained are similar to those described in Example 1, but the protective relief in this case acquires contrast blue coloring perfectly visible against the background of the copper foil.

EXAMPLE 5

A dry film photosensitive resist is obtained by following the procedure described in Example 3, but 0.1 weight part of an inhibitor (hydroquinone) is introduced into the composition of the light-sensitive layer. The sample is tested by following the procedure described in Example 1, but the exposure time is 70 sec. The properties of the dry film photosensitive resist are similar to those described in Example 1. The time of storage of the dry film photosensitive resist with the inhibitor introduced increases to 12 months at 20° C. without light.

EXAMPLE 6

A light-sensitive layer $20\mu$ in thickness is applied to a polyethylene terephthalate film $25\mu$ thick by uniform coating through a spinneret. The composition of the light-sensitive layer is as follows (in weight parts):
  copolymer of normal butylmethacrylate, methacrylic acid, and methacrylamide (molar ratio is 57:35:8 respectively)—100.0;
  product of addition of acrylic acid to an epoxy resin based on 4,4'-dihydroxy-2,2-diphenylpropane (chain length of the product is 800 carbon units, acidic number is 4.6 mg KOH/g, the content of the residual epoxy groups is 0.35 weight %)—25.0;
  trimethylol ethane triacrylate—50.0;
  glycerol-1,3-dipropionate—10.0;
  4-diethylaminobenzophenone—3.0;
  fluorenone—6.0;
  dye "Rhodamine Ж"—0.5;
  paramethoxyphenol—0.2.

The dry film photosensitive resist is prepared and applied by following the procedure described in Example 1, but as a protective film use is made of a polyvinyl alcohol film having a thickness of $25\mu$. The exposure time is 120 sec. After the exposure, the polyethylene terephthalate film is removed from the light-sensitive layer and the sample is developed on a jet apparatus with a 1% aqueous solution of potassium carbonate during 1 minute. The protective relief is red in color and stable towards the same media as the protective relief obtained on the basis of the dry film photosensitive resist described in Example 1.

EXAMPLE 7

A dry film photosensitive resist is prepared by following the procedure described in Example 6, but instead of trimethylol ethane triacrylate use is made of 56.0 weight parts of pentaerythritol triacrylate monoacetate.

The obtained dry film photosensitive resist is used as described in Example 1, but the exposure time is 108 sec and a 1.5% aqueous solution of sodium metasilicate is used as developer.

EXAMPLE 8

A light-sensitive layer $10\mu$ thick is applied to a polyethylene terephthalate film $12\mu$ thick by way of uniform coating through a spinneret. The composition of the light-sensitive layer is as follows (in weight parts):
  copolymer of methylmethacrylate, n-butylacrylate and methacrylic acid (molar ratio is 60:8:32 respectively)—100.0;
  product of interaction of acetic acid with an epoxy resin based on 4,4'-dihydroxy-2,2-diphenylpropane (chair length of the product is 550 carbon units; acidic number is 6.2 mg KOH/g; hydroxyl number is 5.9 weight % of OH groups; content of the residual epoxy groups is 0.15 weight %)—80.0;
  trimethylolpropane triacrylate—75.0;
  benzoine methylate—8.0;
  dye "Basic blue K"—0.5;
  para-tert-butylphenol formaldehyde resin—0.5.

The dry film photosensitive resist is prepared and used by following the procedure described in Example 1, but the exposure time is 75 sec. The protective relief is blue. The properties of the dry film photosensitive resist are similar to those described in Example 1.

EXAMPLE 9

A light-sensitive layer 50μ thick is applied to a polyethylene terephthalate film 60μ thick by uniform coating through a spinneret. The composition of the light-sensitive layer is as follows (in weight parts):

copolymer of methylmethacrylate, n-butylmethacrylate, and methacrylic acid (molar ratio 60:5:35 respectively)—100.0;
product of addition of maleic and methacrylic acids (molar ratio 1:4) to an epoxy resin based on 4,4'-dihydroxy-2,2-diphenylpropane (chain length of the product is 650 carbon units; acidic number 15 mg KOH/g; content of the residual epoxy groups equals zero)—90.0;
triethyleneglycol dimethacrylate—75.0;
benzoine methylate—5.0;
dye "Basic blue K"—0.3;
hydroquinone The dry film photosensitive resist is prepared and used by following the procedure described in Example 1, but the exposure time is 150 sec. The properties of the dry film photosensitive resist obtained are similar to those described in Example 1.

EXAMPLE 10

The preparation and treatment of the dry film photosensitive resist are similar to those described in Example 9, but triethyleneglycol dimethacrylate is replaced with 80 weight parts of trimethylolpropane triacrylate. The test of the obtained dry film photosensitive resist and its properties are similar to those described in Example 1.

EXAMPLE 11

A dry film photosensitive resist is obtained and treated by following the procedure described in Example 9, but triethyleneglycol dimethacrylate is replaced with a mixture of 50.0 weight parts of triethyleneglycol diacrylate and 28.5 weight parts of diacrylate(bisethyleneglycol)-phthalate. The test of the obtained dry film photosensitive resist and its properties are similar to those described in Example 1.

EXAMPLE 12

A dry film photosensitive resist is obtained and treated by following the procedure described in Example 9, but benzoine methylate is replaced with a mixture of photoinitiators consisting of 2.0 weight parts of 2-tert-butyl anthraquinone, 2.5 weight parts of Michler ketone, and 3.0 weight parts of benzophenone. The content of hydroquinone is simultaneously reduced down to 0.3 weight parts. The test of the dry film photosensitive resist and its properties are similar to those described in Example 1, but the exposure time is 120 sec.

EXAMPLE 13

A dry film photosensitive resist is prepared and treated by following the procedure described in Example 9, but the product of addition of maleic and methacrylic acids to an epoxy resin based on 4,4'-dihydroxy-2,2-diphenylpropane is replaced with a mixture of two compounds, namely, polar oligomers A and B:

A. 20 weight parts of the product of addition of methacrylic acid to an epoxy-cyanuric resin which has been obtained by condensation of cyanuric acid with epichlorohydrin in the presence of a basic catalyst (NaOH). The molecular weight of the product is 750 carbon units, the content of the residual epoxy groups is 0.6 weight %, the acidic number 0.45 mg KOH/g.

B. 50 weight parts of the product of addition of acrylic acid to an epoxy resin based on 4,4'-dihydroxydiphenyloxide. The chain length of the product is 520 conventional units; the content of the residual epoxy groups is 0.43 weight %; the acidic number is 3.2 mg KOH/g.

The dry film photosensitive resist is tested by following the procedure described in Example 1, but the exposure time is 180 sec. The properties of the dry film photosensitive resist are similar to those described in Example 1.

EXAMPLE 14

A dry film photosensitive resist is prepared by following the procedure described in Example 1, but the sensitive layer is 20μ thick and has the following composition in weight parts:

copolymer of methylmethacrylate with 35 mol.% of methacrylic acid—100.0;
product of addition of acrylic acid to an epoxy resin obtained by condensation of ethyleneglycol with epichlorohydrine in the presence of boron trifluoride with subsequent treatment with alkali (chain length of the product is 360 conventional units, the content of the residual epoxy groups is 0.65 weight %, the acidic number is 2.5 mg KOH/g)—20.0;
trimethylolpropane acetate diacrylate—70.0;
dimethylphthalate—5.0;
benzoine methylate—10.0.
dye "Rhodamine 6Ж"—0.65;
para-butoxyphenol—0.05.

The dry film photosensitive resist is obtained and tested by following the procedure described in Example 1. The exposure time is 40 sec. The protective relief is red in color and its galvanic stability is similar to that of the dry film photosensitive resist described in Example 1.

EXAMPLE 15

A dry film photosensitive resist is obtained and treated by following the procedure described in Example 1, but the light-sensitive layer has the following composition in weight parts:

copolymer of methylmethacrylate with 33 mol.% of methacrylic acid—100.0;
product of addition of itaconic acid to an epoxy resin based on 4,4'-dihydroxy-2,2-diphenylpropane (molecular weight of the product is 2,900 carbon units, the content of the residual epoxy groups equals zero; the acidic number is 40.1 mg KOH/)—15.0;
product of addition of methacrylic acid to an epoxy resin based on 4,4'-dihydroxy-2,2-diphenylpropane (chain length of the product is 580 conventional units, the content of the residual epoxy groups is 0.45 weight %, the acidic number is 3.6 mg KOH/g)—45.0;
triethylene glycol dimethacrylate—85.0;
2-methoxyethyl ester of benzoine—10.0;
dye "Methylene blue"—0.2;
quinhydrone—0.01.

The light-sensitive layer is coated on a polyethylene terephthalate film 12μ thick, dried, and protected with a polyethylene film 20μ thick. The dry film photosensitive resist is used by following the procedure described in Example 1. The exposure time is 54 seconds. 1% aqueous solution of potassium carbonate is used as a developer. The protective relief is stable in the same media as described in Example 1.

EXAMPLE 16

A dry film photosensitive resist is obtained and treated by following the procedure described in Example 15, but triethyleneglycol dimethacrylate is replaced with a mixture of 35.0 weight parts of triethyleneglycol diacrylate and 50.0 weight parts of trimethylolpropane triacrylate.

The dry film photosensitive resist is tested by following the procedure described in Example 1, but the exposure time is reduced down to 48 sec. The properties of the resist are similar to those described in Example 1.

EXAMPLE 17

A dry film photosensitive resist is obtained and treated by following the procedure described in Example 15, but the content of methacrylic acid in the copolymer is increased up to 35 mol.% and 5.0 weight parts of a plasticizer (1,3-diacetyne) are introduced. The test is performed by following the procedure described in Example 1. The exposure time is 50 sec. A 1% aqueous solution of sodium bicarbonate is used as a developer. The properties of the obtained dry film photosensitive resist are similar to those described in Example 1.

EXAMPLE 18

A dry film photosensitive resist is obtained and treated by following the procedure described in Example 1, but the light-sensitive layer has the following composition in weight parts:
- copolymer of methylmethacrylate, methacrylic acid, and methacrylamide (the molar ratio is 65:20:15 respectively)—100.0;
- product of addition of methacrylic acid to an epoxy resin based on 4,4'-dihydroxy-2,2-diphenylpropane (chain length of the product is 580 carbon units, the content of the residual epoxy group is 0.45 weight %, the acidic number is 3.6 mg KOH/g)—25.0;
- triethyleneglycol diacrylate—25.0;
- benzoine methylate—5.0;
- dye "Methyl violet"—0.15
- para-methoxyphenol—0.1.

The thickness of the dried light-sensitive layer is 25μ. The exposure time is 80 sec. A 2% aqueous solution of sodium carbonate is used as a developer. The dry film photosensitive resist is stable in the same media as that described in Example 1.

EXAMPLE 19

A dry film photosensitive resist is obtained and treated by following the procedure described in Example 18, but triethyleneglycol diacrylate is replaced with 28.0 weight parts of trimethylolpropane diacrylate monoacetate. A plasticizer (7.0 weight parts of triacetyne) is added. The exposure time is increased up to 1.5 min.

The sample is developed in a 1% aqueous solution of potassium carbonate. The dry film photosensitive resist is tested by following the procedure described in Example 1. Its properties are similar to those described in Example 1.

EXAMPLE 20

A dry film photosensitive resist is obtained and treated by following the procedure described in Example, 18 but benzoine methylate is replaced with 12.0 weight parts of 2-ethoxyethyl ester of benzoine. Light sensitivity of the photosensitive resist increases, which makes it possible to reduce the exposure time down to 40 sec. The dry film photosensitive resist is treated by following the procedure described in Example 1; its properties are similar to those described in Example 1.

EXAMPLE 21

A dry film photosensitive resist is obtained and treated by following the procedure described in Example 1, but the light-sensitive layer comprises the following components in weight parts:
- copolymer of methylmethacrylate with methacrylic acid (32 mol.% of the latter)—100.0;
- product of addition of methacrylic acid to an epoxy resin based on 4,4'-dihydroxy-2,2-diphenylpropane (molecular weight of the product is 580 carbon units; the content of the residual epoxy groups is 0.45 weight %; the acidic number is 3.6 mg KOH/g)—70.0;
- triethyleneglycol dimethacrylate—20.0;
- trimethylolpropane triacetate—50.0;
- benzoine ethylate—10.0;
- dye "Basic Blue K"—0.5;
- hydroquinone—0.1.

A dry film photosensitive resist is treated by following the procedure described in Example 1. The time exposure is 70 sec. A 2% aqueous solution of sodium carbonate is used as a developer. The protective relief is stable in galvanic electrolytes cited in Example 1.

EXAMPLE 22

A dry film photosensitive resist is obtained and treated by following the procedure described in Example 21, but the content of polar oligomer is increased up to 75.0 weight parts; the content of triethyleneglycol dimethacrylate is raised up to 60.0 weight parts, and that of trimethylolpropane triacetate is decreased to 10.0 weight parts. The exposure time is 60 sec. The developer is similar to that described in Example 21. The dry film photosensitive resist is treated by following the procedure described in Example 1; the properties of the photosensitive resist are similar to those described in Example 1.

EXAMPLE 23

A dry film photosensitive resist is obtained and treated by following the procedure described in Example 1, but the light-sensitive layer comprises the following components in weight parts:
- copolymer of methylmethacrylate, normal butylmethacrylate, isobutylmethacrylate, and methacrylic acid (the molar ratio is 45:10:10:35)—100.0;
- product of addition of acrylic acid to an epoxy resin based on 4,4'-dihydroxy-2,2-diphenylpropane (the molecular weight of the product is 800 carbon units; the acidic number is 4.6 mg KOH/g; the content of the residual epoxy groups is 0.35 weight %)—50.0;
- triethyleneglycol acrylate methacrylate—30.0;
- benzoine methylate—8.0;

tributylcitrate—5.0;
dye "Rhodamine 6 Ж"—0.5;
quinhydrone—0.01.

The dry film photosensitive resist is tested by following the procedure described in Example 1. The exposure time is 45 sec. A 1% aqueous solution of sodium carbonate is used as a developer. The protective relief is red and stable in the same media as described in Example 1.

What is claimed is:

1. A dry film photosensitive resist comprising a flexible laminated structure consisting of three layers: a first transparent polymer film transmitting UV radiation and having a thickness of 5–100μ; a second light-sensitive layer having a thickness of 5–1,000μ consisting essentially of:
   (a) a carboxyl-containing polymer thickener consisting essentially of a water insoluble copolymer obtained by the polymerization of at least one carboxyl-containing monomer with at least one water insoluble monomer having a water solubility of less than 3 weight % at 20° C. and a pH of 7, the amount of carboxyl-containing monomer in the polymer ranging from 20 to 50 mol%;
   (b) a hydroxyl-containing polar oligomer obtained through addition of an organic acid to at least one epoxy resin, said polar oligomer having a chain length of from 300 to 3,000 carbon units, and containing 4 to 8 weight % OH groups and wherein the number of residual epoxy groups in the polar oligomer ranges from zero to 10% of the initial number of epoxy groups;
   (c) a monomeric substance having a boiling point above 200° C. at 760 mm Hg containing at least one fully substituted ester of a polyatomic alcohol with carboxylic acids, at least two hydroxyl groups of the polyatomic alcohol being substituted by residues of methacrylic and/or acrylic acid; the weight ratio of said polymer-thickener, polar oligomer, and monomeric substance in the light-sensitive layer being 100:15–100:15–100 respectively; a third layer comprising a polymeric film having a thickness of 5–100μ to form a protective layer for the light-sensitive layer and disposed thereon, all of the three layers being adhesively bonded together.

2. A dry film photosensitive resist as claimed in claim 1, wherein the light-sensitive layer contains, as a carboxyl-containing polymer-thickener, a water insoluble copolymer of 50 mol.% of styrene with 50 mol.% of monoisobutyl ester of fumaric acid.

3. A dry film photosensitive resist as claimed in claim 1, wherein the light-sensitive layer contains, as a polar oligomer, a hydroxyl-containing compound obtained through chemical addition of methacrylic acid to an epoxy resin and having a molecular weight from 300 to 1,000 carbon units.

4. A dry film photosensitive resist as claimed in claim 1, wherein the light sensitive layer contains, as a polar oligomer, a hydroxyl-containing compound obtained through chemical addition of acrylic acid to an epoxy resin and having a molecular weight from 300 to 1,000 carbon units.

5. A dry film photosensitive resist as claimed in claim 1, wherein the light-sensitive layer contains, as a polar oligomer, a hydroxyl-containing compound obtained through chemical addition of a mixture of acrylic and methacrylic acids to an epoxy resin and having a molecular weight from 300 to 1,000 carbon units.

6. A dry film photosensitive resist as claimed in claim 1, wherein the light-sensitive layer contains, as a monomeric substance, 1,1,1-trimethylolpropane triacrylate.

7. A dry film photosensitive resist as claimed in claim 1, wherein the light-sensitive layer contains photoinitiators of radical polymerization, the content of said photoinitiators being from 2 to 20% by weight of the carboxyl-containing polymer-thickener.

8. A dry film photosensitive resist as claimed in claim 7, wherein the light-sensitive layer contains ketones, aromatic diketones, multinucleous quinones as photoinitiators of radical polymerization.

9. A dry film photosensitive resist as claimed in claim 1, wherein the light sensitive layer contains a plasticizer in an amount of from 5 to 25% by weight of the light-sensitive layer.

10. A dry film photosensitive resist as claimed in claim 9, wherein the light-sensitive layer contains, as a plasticizer, dibutylphthalate, glycerol triacetate, or trimethylolpropane triacetate.

11. A dry film photosensitive resist as claimed in claim 1, wherein the light-sensitive layer contains an inhibitor of radical polymerization in an amount of from 0.01 to 5.0% by weight of the carboxyl-containing polymer-thickener.

12. A dry film photosensitive resist as claimed in claim 11, wherein the light-sensitive layer contains hydroquinone or para-methoxyphenol as an inhibitor to radical polymerization.

13. A dry film photosensitive resist as claimed in claim 1, wherein the light-sensitive layer contains a dyeing substance in an amount of from 0.1 to 5.0% by weight of the carboxyl-containing polymer-thickener.

14. A dry film photosensitive resist as claimed in claim 13, wherein the light-sensitive layer contains "Methyl violet" or "Rhodamine Ж" as a dyeing substance.

15. A dry film photosensitive resist as claimed in claim 1, wherein a film from polyethylene terephthalate is used as the first above-mentioned layer.

16. A dry film photosensitive resist as claimed in claim 1, wherein a polyethylene film is used as the third above-cited layer.

17. A dry film photosensitive resist as claimed in claim 1, wherein the carboxyl-containing monomer is an unsaturated acid selected from the group consisting of acrylic, methacrylic, maleic, fumaric, and itaconic acids.

18. A dry film photosensitive resist as claimed in claim 1, wherein the carboxyl-containing monomer is monoisoamyl ester of maleic acid.

19. A dry film photosensitive resist as claimed in claim 1, wherein the water insoluble monomer is selected from the group consisting of alkylmethacrylates and alkylacrylates containing from 1 to 10 carbon atoms in an alcohol radical, styrene and its derivatives capable of copolymerizing which are substituted in α-position or in the aromatic ring, esters of vinyl alcohol including vinyl acetate or vinylpropionate, ethers of vinyl alcohol, including vinyl-n-butyl ether, sterically hindered monomers capable of homopolymerization including stilbene, dienes capable of copolymerization with the formation of soluble copolymers including butadiene or diallyl phthalate, mixtures of the aforesaid monomers with water soluble monomers including methacrylamide, acrylamide, and mixtures thereof, wherein the amount of water soluble monomer in the mixture is less than or equal to 20 mol. %.

20. The composition of claim 1, wherein the number of residual epoxy groups in the polar oligomer ranges from 0 to 2% of the initial number of epoxy groups.

21. A method for making a dry film photosensitive resist developable with aqueous solutions of weak alkalies without the addition of organic substances to ensure high stability in acid media, which comprises forming a flexible laminated structure consisting of three layers; a first transparent polymer film transmitting UV radiation and having a thickness of 5–100μ; a second light-sensitive layer having a thickness of 5–1,000μ consisting essentially of:
(a) a carboxyl-containing polymer thickener consisting essentially of a water insoluble copolymer obtained by the polymerization of at least one carboxyl-containing monomer with at least one water insoluble monomer having a water solubility of less than 3 weight % at 20° C. and a pH of about 7, the amount of carboxylic-containing monomer in the polymer ranging from 20 to 50 mol. %;
(b) a hydroxyl-containing polar oligomer obtained through addition of an organic acid to at least one epoxy resin, said polar oligomer haing a chain length of from 300 to 3,000 carbon units, and containing 4 to 8 weight % OH groups and wherein the number of residual epoxy groups in the polar oligomer ranges from zero to 10% of the initial number of epoxy groups;
(c) a monomeric substance having a boiling point above 200° C. at 760 mm Hg containing at least one fully substituted ester of a polyatomic alcohol with carboxylic acids, at least two hydroxyl groups of the polyatomic alcohol being substituted by residues of methacrylic and/or acrylic acid; the weight ratio of said polymer-thickener, polar oligomer, and monomeric substance in the light-sensitive layer being 100:15–100:15–100 respectively; a third layer comprising a polymeric film having a thickness of 5–100μ to form a protective layer for the light-sensitive layer and disposed thereon, all the three layers being adhesively bonded together.

22. The method of claim 21, wherein the carboxyl-containing monomer is an unsaturated acid selected from the group consisting of acrylic, methacrylic, maleic, fumaric, and itaconic acids.

23. The method of claim 21, wherein the carboxyl-containing monomer is monoisoamyl ester of maleic acid.

24. The method of claim 21, wherein the water insoluble monomer is selected from the group consisting of alkylmethacrylates and alkylacrylates containing from 1 to 10 carbon atoms in an alcohol radical, styrene and its derivatives capable of copolymerizing which are substituted in α-position or in the aromatic ring, esters of vinyl alcohol including vinyl acetate or vinylpropionate, ethers of vinyl alcohol, including vinyl-n-butyl ether, sterically hindered monomers incapable of homopolymerization including stilbene, dienes capable of copolymerization with the formation of soluble copolymers including butadiene or diallyl phthalate, mixtures of the aforesaid monomers with water soluble monomers including methacrylamide, acrylamide, and mixtures thereof, wherein the amount of water soluble monomer in the mixture is less than or equal to 20 mol. %.

25. The method of claim 21, wherein the number of residual epoxy groups in the polar oligomer ranges from 0 to 2% of the initial number of epoxy groups.

26. The method of claim 21, wherein the light-sensitive layer contains, as a carboxyl-containing polymer-thickener, a water insoluble copolymer of 50 mol.% of styrene with 50 mol.% of monoisobutyl ester of fumaric acid.

27. The method of claim 21, wherein the light-sensitive layer contains, as a polar oligomer, a hydroxyl-containing compound obtained through chemical addition of methacrylic acid to an epoxy resin and having a molecular wieght from 300 to 1,000 carbon units.

28. The method of claim 21, wherein the light sensitive layer contains, as a polar oligomer, a hydroxy-containing compound obtained through chemical addition of acrylic acid to an epoxy resin and having a molecular weight from 300 to 1,000 carbon units.

29. The method of claim 21, wherein the light-sensitive layer contains, as a polar oligomer, a hydroxyl-containing compound obtained through chemical addition of a mixture of acrylic and methacrylic acids to an epoxy resin and having a molecular weight from 300 to 1,000 carbon units.

30. The method of claim 21, wherein the light-sensitive layer contains, as a monomeric substance, 1,1,1-trimethylolpropane triacrylate.

31. The method of claim 21, wherein the light-sensitive layer contains photoinitiators of radical polymerization, the content of said photoinitiators being from 2 to 20% by weight of the carboxyl-containing polymer-thickener.

32. The method of claim 31, wherein the light-sensitive layer contains ketones, aromatic diketones, multinucleous quinones as photoinitiators of radical polymerization.

33. The method of claim 21, wherein the light-sensitive layer contains a plasticizer in an amount of from 5 to 25% by weight of the light-sensitive layer.

34. The method of claim 33, wherein the light-sensitive layer contains, as a plasticizer, dibutylphthalate, glycerol triacetate, or trimethylolpropane triacetate.

35. The method of claim 21, wherein the light-sensitive layer contains an inhibitor of radical polymerization in an amount of from 0.01 to 5.0% by weight of the carboxyl-containing polymer-thickener.

36. The method of claim 35, wherein the light-sensitive layer contains hydroquinone or para-methoxyphenol as an inhibitor to radical polymerization.

37. The method of claim 21, wherein the light-sensitive layer contains a dyeing substance in an amount of from 0.1 to 5.0% by weight of the carboxyl-containing polymer-thickener.

38. The method of claim 37, wherein the light-sensitive layer contains "Methyl violet" or "Rhodamine ✳ " as a dyeing substance.

39. The method of claim 21, wherein a film from polyethylene terephthalate is used as the first above-mentioned layer.

40. The method of claim 21, wherein a polyethylene film is used as the third above-cited layer.

* * * * *